US 6,372,304 B1

United States Patent
Sano et al.

(10) Patent No.: US 6,372,304 B1
(45) Date of Patent: *Apr. 16, 2002

(54) METHOD AND APPARATUS FOR FORMING SIC THIN FILM ON HIGH POLYMER BASE MATERIAL BY PLASMA CVD

(75) Inventors: Keiichiro Sano; Masaya Nomura; Hiroaki Tamamaki; Yoshinori Hatanaka, all of Shizuoka-ken (JP)

(73) Assignee: Suzuki Motor Corporation, Shizuoka-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/888,954

(22) Filed: Jul. 7, 1997

(30) Foreign Application Priority Data

Jul. 10, 1996 (JP) ............................................... 8-180291
Oct. 30, 1996 (JP) ............................................... 8-288156

(51) Int. Cl.⁷ .............................................. C23C 16/32
(52) U.S. Cl. ........................ 427/571; 427/573; 427/574; 427/575; 427/577; 427/578; 427/249.15
(58) Field of Search ................................ 427/577, 571, 427/575, 578, 573, 574, 249, 249.15

(56) References Cited

U.S. PATENT DOCUMENTS

| 4,560,577 A | 12/1985 | Mirtich et al. |
| 4,835,005 A | 5/1989 | Hirooka et al. |
| 4,927,704 A | * 5/1990 | Reed et al. ................. 428/221 |
| 5,175,020 A | 12/1992 | Doellein et al. |
| 5,279,866 A | * 1/1994 | Bourget et al. |
| 5,453,305 A | * 9/1995 | Lee |
| 5,468,520 A | 11/1995 | Williams et al. |
| 5,492,734 A | 2/1996 | Matsumoto et al. |
| 5,569,502 A | 10/1996 | Koinuma et al. |
| 5,571,571 A | 11/1996 | Musaka et al. |
| 5,753,374 A | * 5/1998 | Camilletti et al. |
| 5,962,083 A | * 10/1999 | Hatanaka et al. ........... 427/571 |

FOREIGN PATENT DOCUMENTS

| JP | 56155535 A | 12/1981 |
| JP | 62132940 A | 6/1987 |
| JP | 63-050028 | * 3/1988 |
| JP | 01-095515 | * 4/1989 |
| JP | 01-155659 | * 6/1989 |
| JP | 02-277775 | * 11/1990 |
| JP | 04-056769 | * 2/1992 |
| JP | 8-52580 | 2/1996 |

OTHER PUBLICATIONS

Bunshah et al, "Deposition Technologies for Films and Coatings", Noyes Publications, pp. 357–359, 1982.*
Pierson, 'Handbook Of Chemical Vapor Deposition (CVD')' Noyes Publications, pp. 107–109, 1992.*
Deposition of SiC Thin Films on Polymer Surface as a Hard Coating by ECR Plasma, Technical Report, 1996, vol. 96, pp. 79–86.

(List continued on next page.)

Primary Examiner—Timothy Meeks
(74) Attorney, Agent, or Firm—Alston & Bird LLP

(57) ABSTRACT

A high quality transparent SiC thin film can be deposited on the surface of a plastic material at low temperature utilizing Electron Cyclotron Resonance (ECR) Plasma CVD techniques, thereby enhancing surfacial hardness without spoiling designability. A magnetic field is applied to a plasma generating chamber by means of a surrounding magnetic coil. Microwaves are then introduced into the plasma generating chamber. Further, an upstream gas is introduced into the plasma generating chamber. ECR plasma is thus generated. A downstream gas is then supplied to the chamber from an inlet. Furthermore, the ECR plasma is passed through a mesh placed between the inlet and a polymer base material or between the plasma generating chamber and the inlet. Accordingly, a SiC film is deposited on a surface of a polymer base material.

17 Claims, 8 Drawing Sheets

OTHER PUBLICATIONS

Remote Plasma SiC Deposition From Organosilicons, S. Wickramanayaka et al., Technical Report, 1993, vol. 93, pp. 9–13.

Deposition of SiC Thin Films on Polymer Surface as a Hard Coating by ECR Plasma, Technical Report, 1993, vol. 93, pp. 86–91, Institute of Electronics and Communiction Engineers of Japan.

Deposition of $SiO_2$ Films on Polymer Substrate Using ECR Plasma and Analysis of Film Quality, Suzuki Technical Review vol. 21 published Jan. 31, 1995, pp. 49–55.

Low Temperature Deposition of $SiO_2$ Thin Films on Plastics As A Hard Coating Using $TEOS/O_2$–Plasma, Preprints of the Lectures No. 956 published by Jidosha–Gitjutsukai on Sep. 1, 1995, pp. 41–44.

Low Temperature Deposition of $SiO_2$ Films on Polymer Surfaces by $TEOS/O_2$–ECR Plasma, Sen–i Gakkai Preprints 1995(F), The Society of Fiber Science and Technology, Japan, Oct. 25–26, 1995, pp. F–83.

1995 Fall meeting of the Materials Research Society, Boston, MA, Nov. 28, 1995 presentation (entry form).

Low Temperature Deposition of $SiO_2$ Films on Polymer Surfaces by $TEO/O_2$–ECR Plasma, The Fourth Meeting to Present Advanced Technologies in Companies, Shizuoka Kagaku–Kogaku Konwa–Kai, Jan. 31, 1996, pp. 25–30.

Low Temperature Deposition on $SiO_2$ Using TEOS in ECR Plasma (3), Extended Abstracts, 43rd Spring Meeting, 1996, published by the Japan Society of Applied Physics and Related Societies on Mar. 26, 1996, p. 844.

Deposition of High Quality $SiO_2$ Films Using Teos by ECR Plasma, Mat. Res. Soc. Symp. Proc., vol. 396; pp. 539–543 (1996).

* cited by examiner

METHOD AND APPARATUS FOR FORMING SiC THIN FILM ON HIGH POLYMER BASE MATERIAL BY PLASMA CVD

BACKGROUND OF THE INVENTION

The present invention relates to a method and apparatus for forming SiC thin films on polymer base materials by plasma (assisted or enhanced) CVD.

In a time in which high-performance globally-environmentally-friendly motor vehicles are desired, the use or adoption of plastic parts in motor vehicles has been promoted with a view toward enhancing weight reduction, thereby the fuel economy of motor vehicles. Notably, thermoplastic resins have attracted attention as an easy-to-recycle material. Accordingly, attempts have been made to positively use thermoplastic resin materials in motor vehicles. Plastic materials, however, have low mechanical strength and surfacial hardness, as compared with those of metallic materials, and are inferior in abrasion resistance compared to metallic materials. Moreover, the discoloration and reduction in hardness of the surfaces of plastic materials are caused by ultraviolet radiation and heat from the sun. Thus, the weather resistance of plastic materials may not be high. Taking the functions and qualities of motor vehicles into consideration, there are limits to which parts can employ the use of plastic materials. Thus, unless the perormance of plastic materials can be enhanced through surface treatment, the promotion and adoption of plastic parts in motor vehicles is not expected.

Heretofore, surface treatment methods of forming a thin film on a plastic material by plasma CVD have been employed. In accordance with plasma CVD, the plastic material can be coated with a high quality film while removing impurities from the thin film as a result of heating a substrate so that the substrate temperature rises to 400 degrees centigrade or more. It was, however, impossible to coat a low heat-resistance plastic material (see S. Wiskuramanayaka, Y. Hatanaka and et al., 1993, Technical Report, Vol. 93, pp. 86–91, Institute of Electronics and Communication Engineers of Japan). Thus, a method has been developed in which plasma treatment is first performed on a polymer base material in the same plasma system by using a non-polymeric gas, such as CO, $H_2$ or $O_2$ gas, so that the adhesive or adhesion strength of the coat is enhanced. Subsequently, a high-durability plasma polymerized coat is formed by performing the plasma polymerization of organic silicides. Although, such a coat is superior in the adhesive strength for adhering to the base material, the coat contains a high proportion of impurities such as carbon and water. Therefore, such a coat has problems in that it lacks high hardness and is inferior in abrasion resistance (see Japanese Patent Laid-Open No. Sho 62-132940/1987 Official Gazette).

On the other hand, when introducing a reaction or source gas into a vacuum reaction chamber, applying a magnetic field (having a flux density) of 875 gausses (G) thereto, and applying microwaves thereto, electrons contained in plasma are accelerated by an electric field caused by the Electron Cyclotron Resonance (ECR) effect, thereby generating a high-density plasma. Furthermore, there has been developed an ECR plasma system utilizing this phenomenon (see Japanese Patent Laid-Open No. Sho 56-155535/1981 Official Gazette).

The aforementioned conventional method, however, uses a large amount of a supply gas. Thus, this conventional method has the following problems. Principly, the operating cost is high. Further, the extent contamination in the system is very high, thus necessitating high costs and large amounts of labor to maintain the system. Moreover, it takes a large amount of time to form a coat. Therefore, a large amount of heat is added to the plastic substrate. Thus, serious damage is caused to the substrate and, consequently, residual strain and cracks occur in the coat.

Thus, a plasma CVD method and apparatus has been developed for forming SiC thin films on polymer base materials by depositing a transparent SiC thin film on the surface of a plastic material through the use of ECR plasma (enhanced) CVD (namely, Electron Cyclotron Resonance Plasma Assisted Chemical Vapor Deposition) techniques, by which the low-temperature deposition of a film of high quality can be achieved, to thereby increase the surfacial hardness of the film without spoiling the designability thereof (see Japanese Patent Application No. Hei 8-52850/1996). In this apparatus, a mesh is placed between a plasma generating chamber and a gas supplying inlet. Further, electrons contained in plasma are trapped by this mesh. The trapped electrons are then made to escape therefrom by way of an electrical ground. Thereby, only radicals (namely, neutrons) are permitted to pass through the mesh. Consequently, the deposition rate is enhanced.

However, even when employing the aforementioned techniques, there is a limit to the hardness of a $SiO_2$ film to be formed as a coat. Thus, there has been a demand for a thin film which has higher hardness. Additionally, $SiO_2$ coats or films transmit ultraviolet light. Therefore, even when such a thin film is formed on a plastic material, there has been concern that the plastic material will be deteriorated by ultraviolet light.

Specifically, SiC film, which have a band gap of about 4.5 to 5 eV, have a smaller band gaps and accompanying ultraviolet cut-off characters, as compared with other SiC films, having band gaps of about 8 eV.

SUMMARY OF THE INVENTION

Accordingly, an object of the present invention is to provide a method and apparatus for forming a SiC thin film on a polymer base material by plasma CVD, by which a SiC thin film is provided with sufficient hardness and weather-resistance and resistance to ultraviolet light which can be formed on a plastic base material at a low temperature.

To achieve the foregoing object, in accordance with an aspect of the present invention, there is provided a method for forming SiC thin films on polymer base materials by plasma CVD comprising the steps of: applying a magnetic field to a plasma generating chamber by means of a magnetic coil placed therearound; introducing a microwave into aforesaid plasma generating chamber; introducing an upstream gas into aforesaid plasma generating chamber to thereby generate an ECR plasma; supplying a downstream gas thereto from an inlet; and passing the ECR plasma through a mesh placed between aforesaid inlet and a polymer base material or between aforesaid plasma generating chamber and aforesaid inlet to thereby deposit a SiC thin film on a surface of a polymer base material.

In accordance with another aspect of the present invention, there is provided an apparatus for forming SiC thin films on polymer base materials by plasma CVD, comprising: a plasma generating chamber, to which a magnetic field is applied by a magnetic coil placed therearound, and a microwave is introduced therein, along with an upstream gas introduced therein, for generating ECR plasma; an inlet for supplying a downstream gas therefrom to aforesaid plasma generating chamber; and a mesh placed between aforesaid inlet and a polymer base material or between aforesaid plasma generating chamber and aforesaid inlet.

DESCRIPTION OF THE PREFEERED EMBODIMENTS

Figure 1:
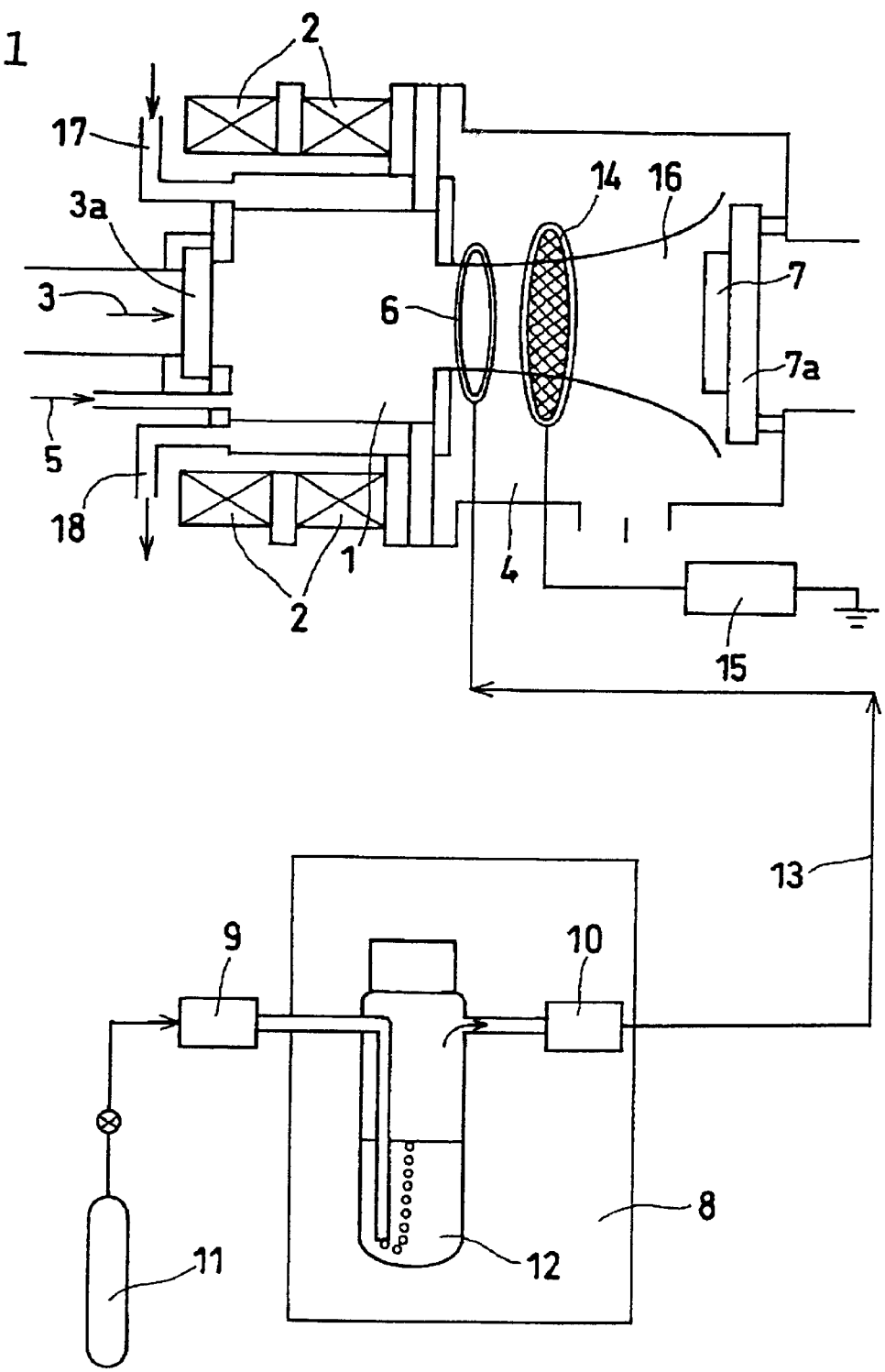
FIG. 1 is a conceptual diagram illustrating the configuration of ECR plasma CVD apparatus embodying the present invention, namely, an embodiment of the present invention.

FIG. 1 illustrates a configuration of an ECR plasma CVD apparatus of an embodiment of the present invention.

This apparatus is an ECR plasma CVD apparatus of the transverse configuration type. Further, magnetic coils 2 are placed on the periphery of a plasma generating chamber 1. Then, a magnetic field, its presence being one of the ECR operating conditions, is applied to the plasma generating chamber 1. Moreover, microwaves are introduced into the generating chamber 1. Thus, plasma is generated. Incidentally, reference character 3a designates quartz or silica glass. The distribution of the magnetic field is of the divergent magnetic field type, in which the strength of the magnetic field decreases in the direction from a plasma generating chamber 1 towards a sample chamber 4.

Then, an upstream gas is introduced through line 5 into the plasma generating chamber by controlling the flow rate thereof by means of a mass flow controller. Thus, ECR plasma is generated therein. The gas supplied upstream is, for example, $H_2$, He or Ar gas. Incidentally, $H_2$ gas decomposes hexamethyldisilane (HMDS) most effectively and thus is most suitable.

Furthermore, another kind of gas is poured into the chamber 1 through a ring-like inlet 6 downstream by controlling the flow rate thereof. Thus, a SiC film can be deposited on a surface of polymer base materials, e.g., a plastic substrate such as PC (polycarbonate resin) or PP (polypropylene). Further, in addition to polycarbonate (PC) and polypropylene (PP), high polymers such as polyethylene (PE) and polystyrene (PS) may be used as materials of the plastic substrate 7.

In accordance with the present invention, a gas obtained by performing the bubbling of HMDS with He gas is used as a downstream gas, i.e., a source gas to be poured from the ring-like inlet 6. Incidentally, other kinds of silicides which are known in the prior art are suitable for the method and apparatus of the present invention.

[Chemical Formula 1]

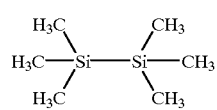

In the case of the plasma CVD using this HMDS and a hydrogen gas, first, the scission of the Si—Si bond of HMDS is performed by the action of hydrogen radicals originated from upstream plasma, so that precursors are produced. Further, it is considered that the reaction between such precursors results in the deposition of a SiC film.

Figure 2:
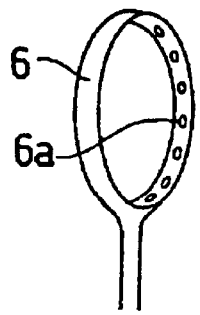
FIG. 2 is an enlarged perspective view of a ring-like inlet of the ECR plasma CVD apparatus embodying the present invention, namely, the embodiment of the present invention.

A supply system for supplying a source gas to be fed from the ring-like inlet 6 according to the present invention is composed of: 1) a thermostatic chamber 8; 2) MFC (mass flow controller) units 9 and 10; 3) a bubbling He-gas tank 11; 4) a reservoir containing liquid HMDS; and 5) a supply line 1. In this supply system, a He gas is introduced through the MFC unit 9 into liquefied HMDS contained in the reservoir 12, which is maintained at 28 degrees centigrade, of the thermostatic chamber 8 as a bubbling gas. Then, the HMDS having undergone the bubbling is supplied from the inlet 6 through the MFC unit 10 and the supply line 13 as a downstream gas. Moreover, the inlet 6 has a plurality of small holes 6a that are bored in the inner surface portion of the ring-like tube as illustrated in FIG. 2. Gas is adapted to evenly flow out of the small holes.

Furthermore, in this apparatus, a grounded circular mesh 14 is provided between the ring-like supply gas inlet 6 and the substrate 7. The mesh 14 is generally made of a metal, preferably, stainless steel. This mesh 14 is grounded. Alternatively, a positive or negative DC voltage is applied to the mesh 14. Reference numeral 15 designates a DC power supply. The mesh 14 serves to trap electrons contained in plasma and then make the electrons escape to the ground and thus permit only radicals (neutrons) contained in the plasma to pass therethrough. Therefore, the diameter of the mesh, the thickness of wires and the dimension of a grid or lattice are important.

The size of the mesh 14 should be larger than each of the diameters of the ring-like supply gas inlet 6 and the plasma stream 16 at this place.

For example, in the case that the mesh 14 is composed of stainless-steel wires, if the wires are too thick, the shadows of the wires are transferred onto the surface of a formed film and thus the surface thereof becomes uneven. Thus, the wires should be to a certain extent thin. Hence, it is preferable that the diameter of the wire be equal to or more than 0.1 mm but is not more than 1 mm.

If the grid or lattice size of the mesh 14 is too large, the mesh 14 cannot trap electrons contained in the plasma, so that the electrons pass therethrough together with radicals. Thus, the grid or lattice size should be small to a certain extent. Preferably, the grid or lattice size should not be more than 5 mm×5 mm. Incidentally, the shape of the grid or lattice does not have to be limited to a certain shape. For instance, the shape may be octagonal. Additionally, it is preferable that the area of one grid or lattice be not more than 25 mm².

Furthermore, the matching among the location of the mesh 14 provided in the ECR plasma CVD apparatus and the positions of the ring-like supply gas inlet 6 and the substrate 7 is not limited to a specific material, e.g., plastic, metallic or ceramic material as it is important for achieving the low-temperature high-speed formation of a SiC film.

Further, the quantities of electrons, negative and positive ions contained in plasma can be controlled by grounding the mesh 14 or applying negative to positive voltages to the mesh 14. When DC voltages ranging from −50 V to +50 V are applied to the mesh 14, the speed of film formation is increased. Especially, at 0 V, namely, in the case that the mesh 14 is grounded but no voltage is applied thereto, the highest electron trapping effects can be obtained. Further, the film forming speed becomes extremely high. It is desirable for increasing a SiC-film forming speed that the mesh 14 be grounded.

Incidentally, in the case that a DC voltage is directly applied to the mesh 14, the mesh 14 should be completely insulated from the reactor chamber.

Additionally, a stainless-steel mesh 14 serves to trap electrons contained in plasma and then make the electrons conduct to the ground and thus permit only radicals (neutrons) contained in the plasma to pass therethrough.

In order to coat the substrate 7 with a SiC film of good quality, which does not contain impurities, without heating, the precise control of plasma generation conditions are needed. It is also important to precisely control the amount of the supply source gas. In the case where HMDS, having undergone the bubbling, through the use of the He gas, is used as the source gas, the amount of the supply gas is preferably between 0.8 to 1 standard cc/min (sccm) [(at 25 degrees centigrade)]. If the amount exceeds 1 sccm, a surplus film begins to adhere to the inside of the reactor chamber. As a result, the reactor chamber is contaminated. This impedes the coating of the substrate 7 with a SiC film of good quality. In contrast, in the case of using $H_2$ gas, the supplied amount thereof is preferably between 5 and 50 sccm. Moreover, the inner pressure of the sample chamber is preferably within a range from 0.05 to 2 Pa. Furthermore, if the mesh 14 grounded under such plasma conditions is placed at a position at a distance of 0 to 50 mm from the ring-like supply gas inlet 6, the film forming speed is greatly increased. Thus, a film is formed effectively. Therefore, the use of the mesh improves the quality of the film.

The microwave output is preferable between 100 W and 200 W. Further, microwave outputs in the vicinity of 150 W are preferable. As is understood from the aftermentioned example, a deposition rate is decreased when the output exceeds 150 W.

Preferably, the substrate temperature is at room temperature. However, in the case of employing heatable plastic materials, the substrate is preferably heated to 200 degrees centigrade or greater, more particularly, within a range of 200 to 250 degrees centigrade. This is because the available proportion of oxygen (O) is decreased.

The following materials are examples of plastic materials which are resistant to heat at 200 degrees centigrade or less. Polyacetal resin, epoxy resin, polybutylene terephthalate, polypropylene, methacrylic resin, polycarbonate resin, polystyrene, ethylene acid type bis-polymer, ethylene vinyl alcohol, polyphenyl ether, polybutadiene, ABS resin, vinyl chloride, polyarylates, polyuretahne resin, melamine resin, unsaturated polyester resin, urea resin, high-density polyethylene, low-density polyethylene, and normal chain low-density polyethylene are examples of such plastic materials.

Further, the following materials can be cited as plastic materials, which are resistant to heat at 200 degrees centigrade or more, particularly, preferably used within a range of 200 to 250 degrees centigrade). Polyimide resin, polyethylene terephthalate resin, polyamid phenol resin, fluororesin, silicone resin, polyphenylene sulfide, polyetherketone resin, polyethersulfone resin and aromatic polyesters are examples of such plastic materials.

Moreover, in the apparatus of FIG. 1, cooling water is supplied from a cooling water supply port 17 and is expelled from a cooling. water exhaust port. In addition,reference character 7a designates a heating unit for heating the substrate 7.

EXAMPLES

Thin film forming experiments were performed by using the ECR plasma CVD apparatus of FIG. 1.

Plastic Test-Piece

A transparent PC material and an impact-resistant PP material, which are frequently used in motor vehicles, were selected as test pieces. Further, an injection-molded plastic flat plate (60×60×3 mm) was used as a test piece.

Source Gas

HMDS having undergone the bubbling by use of He gas was used as the downstream gas.

Method of Depositing SiC Film

In this experiment, the magnetic coils were placed on the periphery of the plasma generating chamber in the ECR plasma CVD apparatus of the transverse configuration type. Moreover, a magnetic field having a flux density of 875 G, which is one of ECR operating conditions, was applied into the plasma generating chamber. Furthermore, microwaves were introduced into the generating chamber to thereby generate plasma. The distribution of the magnetic field caused by the magnetic coil was of the divergent magnetic field type, in which the strength of the magnetic field decreased in the direction from the plasma generating chamber 1 to the sample chamber 4. High-purity $H_2$ gas was used as the upstream gas by controlling the flow rate thereof. Thus, the $H_2$ gas was introduced into the plasma generating chamber 1 to thereby generating ECR plasma. The downstream gas containing HMDS, which had undergone the bubbling by use of He gas, was controlled in such a manner as to be maintained at 28 degrees centigrade. Such a downstream gas was flowed from the ring-like inlet 6, whose diameter was 150 mm, downstream by controlling the flow rate thereof. Thus, SiC films, which were 1.0 μm, were deposited on the surfaces of PC and PP materials. Moreover, a film deposition experiment in the case of placing the grounded circular mesh 14 (incidentally, the diameter thereof was 160 mm, and this mesh was composed of stainless steel wires, which are 0.2 mm in diameter, and the grid or lattice size was 1.5×1.75 mm) between the HMDS inlet 6 and the substrate 7 was performed. The mesh 14 was placed downstream at the position at a distance of 5 mm from the HMDS inlet. In addition, the preferable conditions of the plasma CVD are listed below in TABLE 1.

TABLE 1

ECR PLASMA CONDITIONS

| | |
|---|---|
| He (Carrier Gas for HMDS) | 1.0 sccm |
| $H_2$ (Upstream Gas) | 10 sccm |
| Pressure | 0.7 Pa |
| Microwave Output | 150 W |
| Substrate Temperature | Room Temperature |

Method of Evaluation of SiC Film

The chemical composition of the deposited SiC film was measured by using XPS (X-ray Photoelectron Spectroscopy) and FTIR (Fourier Transform Infrared Spectroscopy). The thickness of the SiC film deposited on the Si(100) substrate was measured by utilizing Ellipsometric method. Further, the ultraviolet spectral transmission factor or transmittance curve (210 to 400 nm) of the SiC film was measured by using a recording spectrophotometer (U-3000 manufactured by Hitachi Limited). Furthermore, the SiC film deposited on the plastic material was observed by using SEM (Scanning Electron Microscope). Moreover, the hardness of a very-shallow surface layer, on which the SiC film is deposited, of the plastic material was difficult to determine if Rockwell hardness or Vickers hardness was employed, and thus was measured by using a dynamic hardness meter (DUH-50 manufactured by Shimadzu Corporation). In the case of this technique, a diamond indentor, shaped like a triangular pyramid whose dihedral angle was 115 degrees, was perpendicularly inserted into the surface of the plastic material at a constant loading speed (=0.048 gf/sec). At that time, the value of a load imposed in the direction of depth was directly recorded and then the hardness was calculated. The dynamic hardness used at that time was computed by using the following equation:

$$DH = \alpha \times P / D^2$$

where α denotes a constant (=37.838) which depends upon the shape of indentor; P a test load value; and D an indentation depth (μm), to which the indentor was inserted (at that time, the indentation depth was set at a value of 0.8 μm from the surface of the film corresponding to the deposited film, whose thickness was 1 μm).

Plasma Film Forming Conditions And Characteristics of SiC Film

Effects of Mesh in Deposition of SiC Film

Data representing the deposition rates in the cases, in which there was no mesh in the plasma reactor chamber and in which a mesh was provided in the apparatus, respectively, are listed in TABLE 2 for the comparison therebetween. At that time, the substrate was maintained at room temperature. As a result of using the mesh, the deposition rate was significantly increased. It is considered that charged particles were trapped by the metallic mesh used in the reactor chamber. Accordingly, film damage was decreased as ions which would have been adsorbed by the substrate were instead trapped by the mesh. Thus, the presence of charged particles on the SiC film, including ions, was decreased.

TABLE 2

| Film Deposition Rate of SiC Film Rate (Å/min) | |
|---|---|
| No Mesh | Mesh Is Provided |
| 35.0 | 257 |

Figure 3:
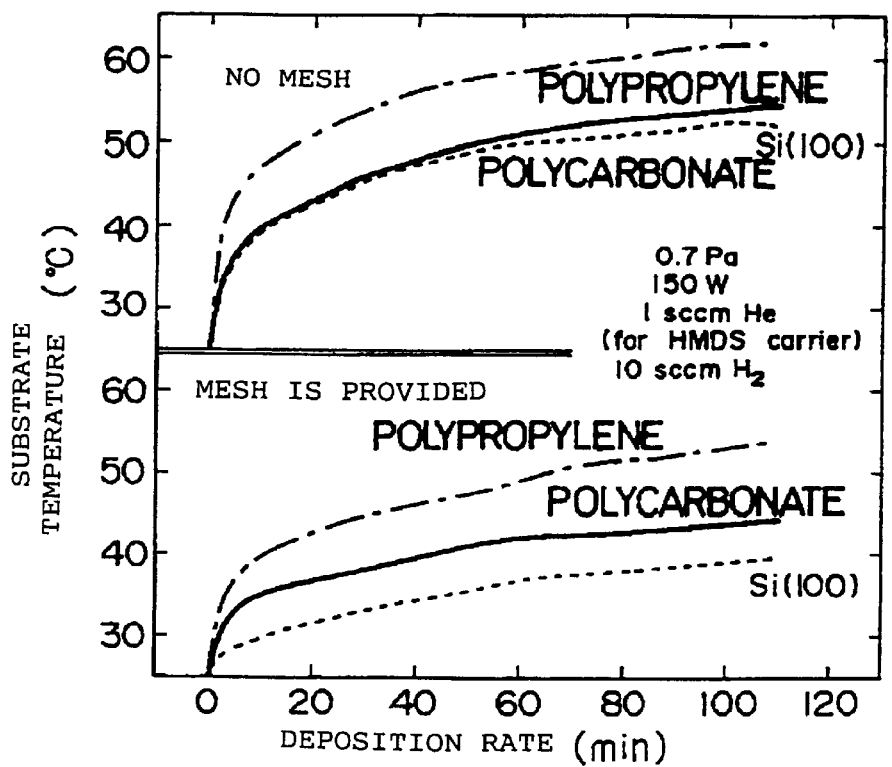
FIG. 3 illustrates the relation between the substrate temperature and the deposition rate.

Referring further to FIG. 3, there is shown a change in temperature of the surface of the substrate versus the deposition time in each of the cases in which there was no mesh in the plasma reactor chamber and in which a mesh was provided in the apparatus, respectively. The measurement of the temperature was measured by providing a thermocouple on the surface of the substrate and performing the grounding thereof. In each of the cases concerning the plastic material and the Si substrate, with the elapse of time, a rise of the temperature due to plasma irradiation were observed. Especially, in the case of using the mesh, the rise of the substrate temperature was greatly suppressed. Thus, it was found that the use of the mesh is more suitable for depositing a film on a low-heat-resistance plastic material. It is considered that this was also because the damage due to the charged particles and ions contained in the plasma were decreased by the mesh. The rise of the temperature of the substrate in the case of using the PC material was smaller than that of the case of the PP material. Furthermore, the rise of the temperature thereof in the case using the Si substrate was minimized. It is considered that this phenomenon resulted from the differences in the coefficient of thermal conductivity among the substrates, therefore if the coefficient of thermal conductivity was low, heat originated from what is called plasma shower was difficult to dissipate and thus was stored in the substrate and that as a result the rise in temperature was increased.

Figure 4:
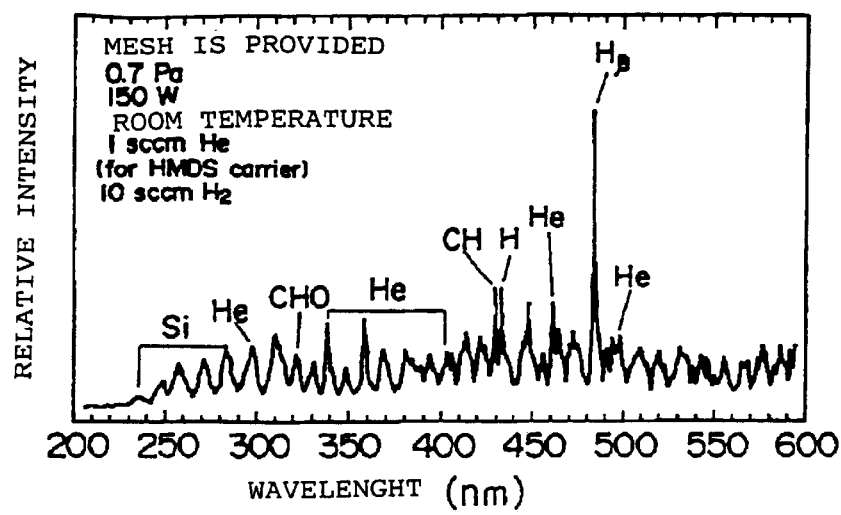
FIG. 4 is an emission spectrum of plasma in the case of the deposition of a SiC film by using a mesh.

FIG. 4 illustrates the emission spectrum of plasma in the case of the deposition of a SiC film using the mesh. Emission peaks of hydrogen atoms corresponding to Hγ and Hβ were observed at wavelengths of 434 nm and 486 nm, respectively. Further, a few emission peaks of Si atoms obtained by the decomposition of HMDS were observed in the range of wavelengths between 230 and 290 nm. The emission peaks of CH atoms were observed at wavelengths of 315 nm and 431 nm, respectively. As is seen from these emission spectra, HMDS molecules were decomposed downstream by what is called hydrogen radical shower originating from the upstream plasma while precursors of SiC were generated in a vapor phase. In addition, the emission peaks of the carrier gas, namely, the He gas were observed in a wide range of wavelengths. Incidentally, the spectrum in the case of using the mesh, the intensity of the emission of CH atoms was decreased and thus, the frequency or degree of the scission of $SiCH_3$ bonds in the vapor phase was lower, as compared with the case of using no mesh.

The chemical composition of the film deposited on the plastic material by using the mesh are listed in TABLE 3. This composition ratio was calculated from a result of the measurement performed by using the XPS. The composition ratio (Si/C) of Si to C was 0.58. In addition, it was found that oxygen atoms were contained. It is considered that this was caused as a result of the desorption of oxygen atoms adsorbed in the surface portion of the plastic material and in the chambers, subsequently these oxygen atoms were taken into the film. Thus, the presence of oxygen was not a direct result of the deposition of the film at room temperature.

TABLE 3

Atomic Ratio of Deposited Film

| Test Piece | Atomic Ratio (%) | | |
|---|---|---|---|
| | Si | C | O |
| Mesh Is Provided | 30.4 | 52.3 | 17.3 |

Figure 5:
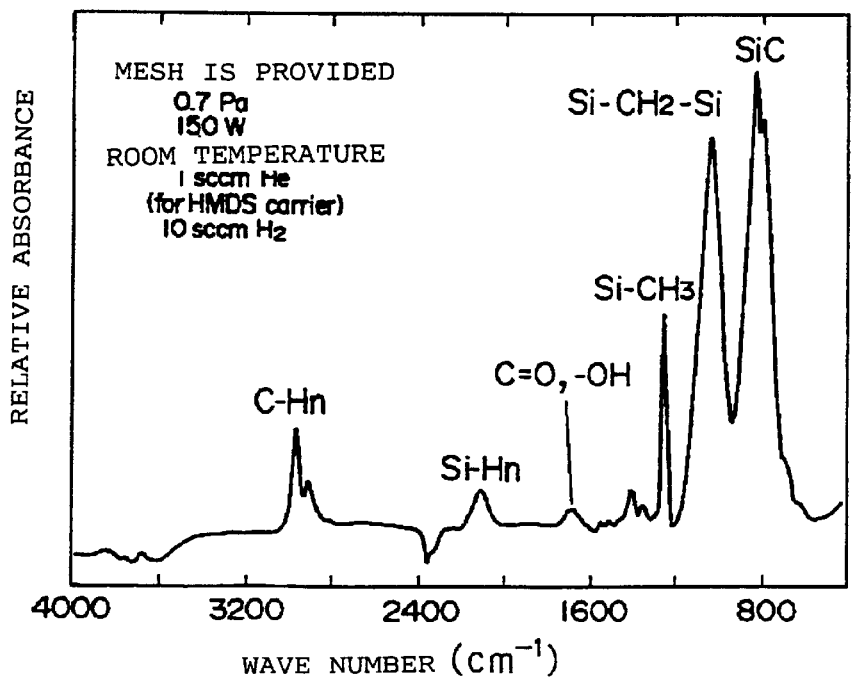
FIG. 5 is a FTIR spectrum of a film deposited by using the mesh.

Further, FIG. 5 illustrates FTIR spectrum of the film deposited by using the mesh. There was noticable absorption of SiC at 806 cm$^{-1}$. In addition, the slight absorption of Si—CH$_2$—Si at 1004 cm$^{-1}$ was observed; that of SiCH$_3$ at 1263 cm$^{-1}$; and hydrocarbons of CH$_n$ (Stretching) in the range of 2860 to 3000 cm$^{-1}$; and that of SiH$_n$ (Stretching) in the range of 2000 to 2160 cm$^{-1}$; and that of a carbonyl group at 1720 cm$^{-1}$.

Incidentally, no differences were observed between the spectra measured in the cases in which there was no mesh in the plasma reactor chamber and in those where a mesh was provided in the apparatus, based upon results of the measurements performed by using XPS and FTIR.

Influence of Substrate Temperature

Figure 6:
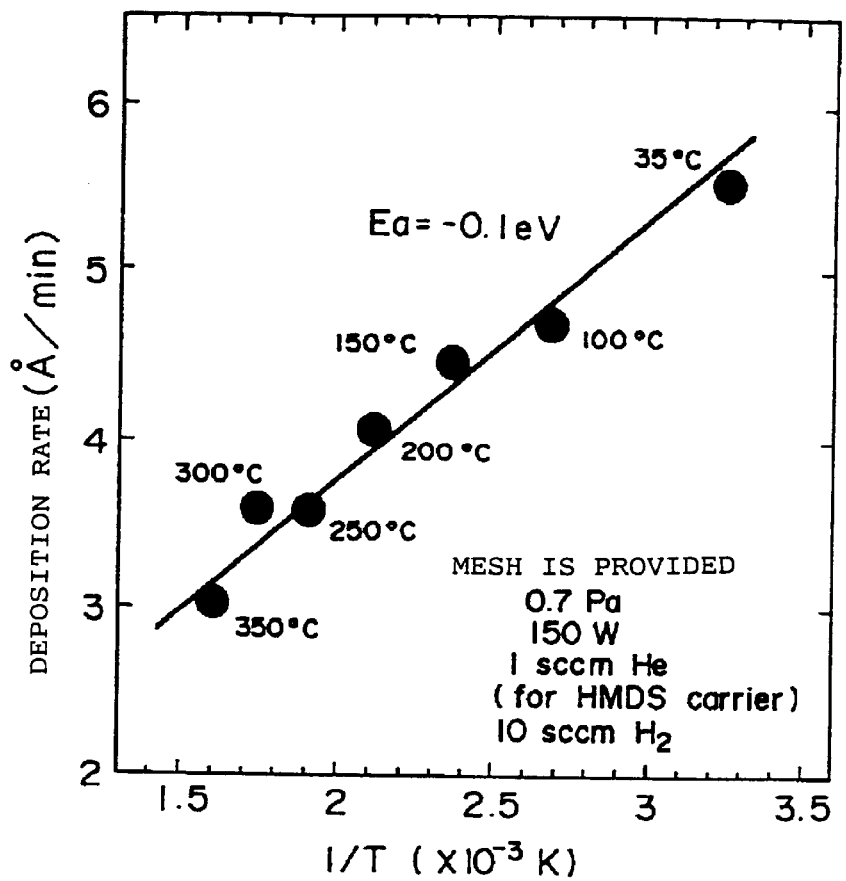
FIG. 6 depicts Arrhenius plots of Si-substrate temperature and the deposition rate in the case of using the mesh.

FIG. 6 illustrates Arrhenius plots corresponding to the substrate temperature and the deposition rate of the Si substrate in the case of using the mesh. Activation energy had a value of (−0.1 eV). Further, the trend was for the deposition rate to decrease with the rise in temperature of the Si substrate. This suggests that in the case of the deposition reaction of the SiC film, by utilizing ECR plasma, the vapor phase reaction proceeds simultaneously with the adsorption/desorption reaction caused on the surface of the substrate.

Figure 7:
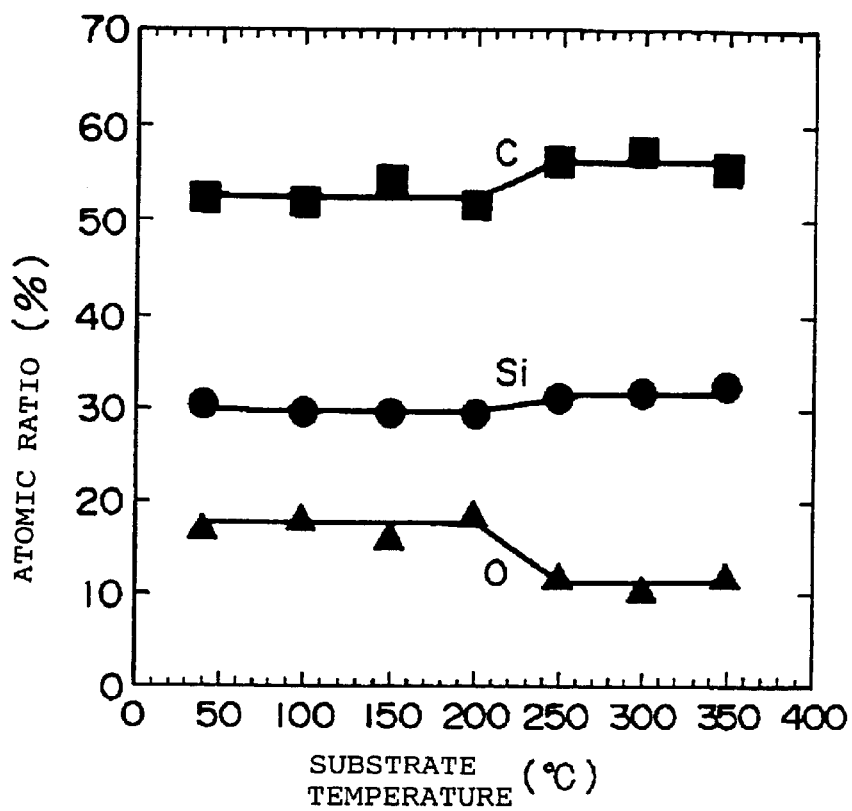
FIG. 7 illustrates the change in chemical composition of a deposited film versus the substrate temperature.

FIG. 7 illustrates a change in the chemical composition of the deposited film versus the substrate temperature. There was not observed a sharp change in the composition ratio between Si and C. When heating the substrate to 200 degrees centigrade, the content by percent of oxygen decreased. The improvement of the quality of the film was observed. Moreover, it was found from FTIR spectrum that there was a decrease in value of the absorption peak of the carbonyl group at 1700 cm$^{-1}$ owing to the rise of the substrate temperature. It is considered from these results that the rise of the substrate temperature promoted the desorption reaction of oxygen contained in the film.

Further, the concentration of hydrogen contained in the film was calculated from the area of the absorption peak of the CH-bond, which was observed at 2900 cm$^{-1}$ in FTIR spectrum. It was, however, not observed that a change in the concentration of hydrogen occurred with the rise of the substrate temperature. Moreover, the concentration of hydrogen was at a constant value of $1.3 \times 10^{23}$ (H/cm$^3$).

Influence of Quantity of Supplied Source Gas

Figure 8:
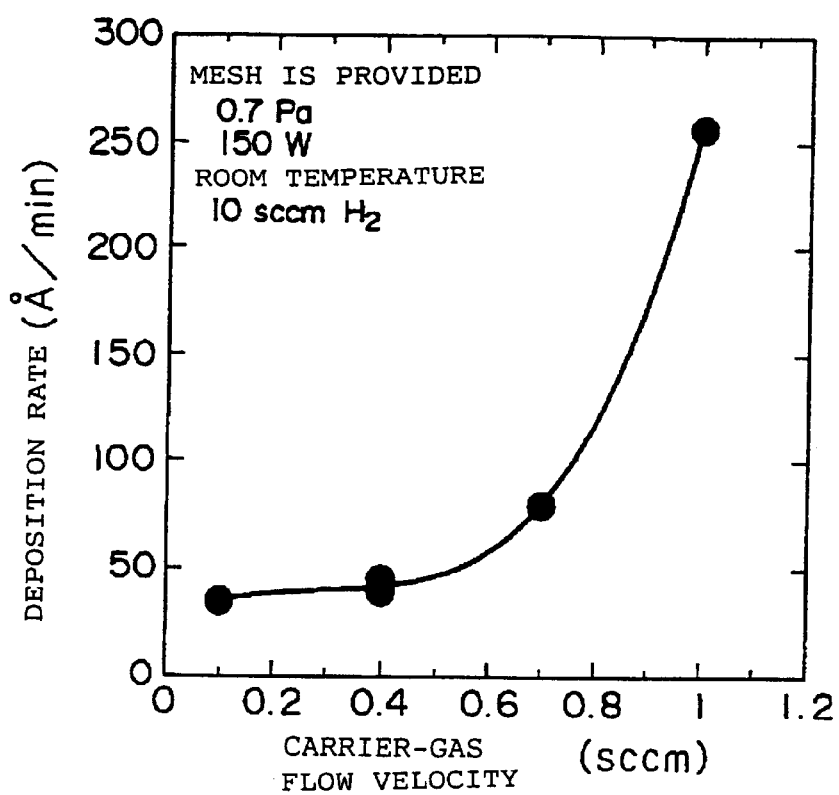
FIG. 8 illustrates the change in deposition rate versus an amount of supplied He gas which is a carrier gas for HMDS.

FIG. 8 illustrates a change in the deposition rate versus the quantity of supplied He gas, which is the carrier gas of HMDS. It was observed that with an increase of the amount of HMDS, there was a considerable increase in the deposition rate. This suggests that a sufficient amount of hydrogen radical is present correspondingly to the amount of supplied HMDS.

Influence of Inner Pressure of Reaction Chamber

Figure 9:
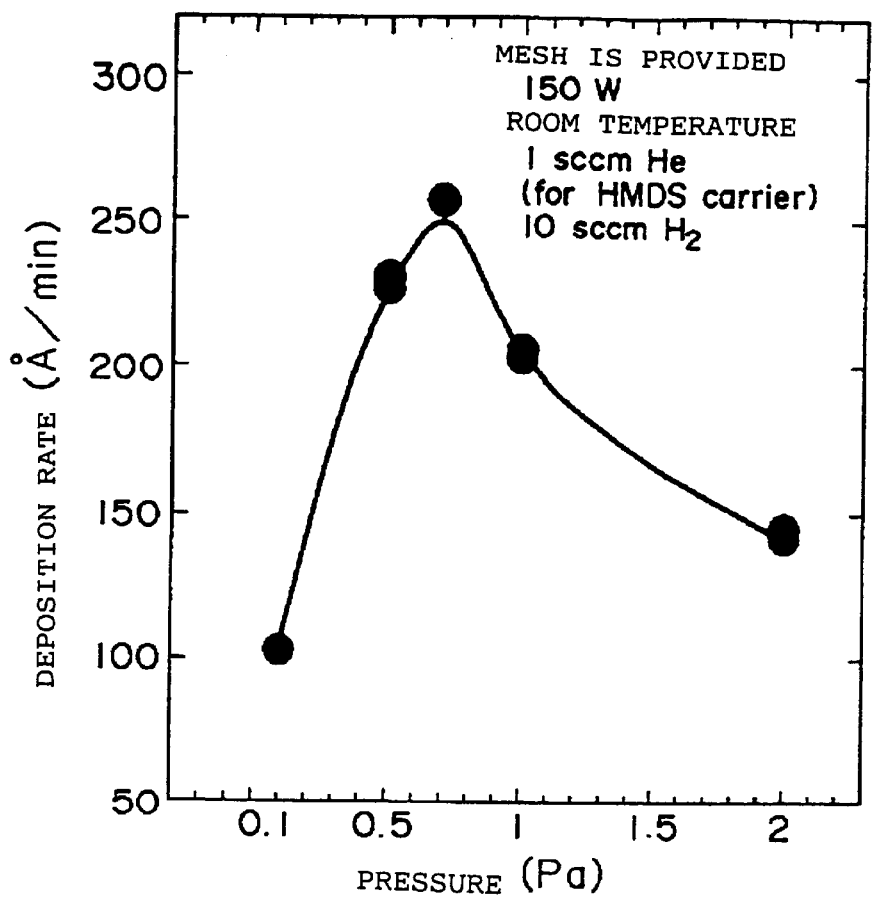
FIG. 9 illustrates the change in deposition rate versus the internal pressure of a reactor chamber.

FIG. 9 shows a change in the deposition rate versus the inner pressure of the reaction chamber. When the pressure was increased from 0.1 Pa to 0.7 Pa, a considerable increase in the deposition rate was observed. However, if the pressure was further increased, the deposition rate dropped. The cause of this phenomenon is considered as follows. First, when the pressure rises, the total amount of the radical increases, so that the reaction is promoted and the deposition rate rises. However, when the pressure is not less than 0.7 Pa, the amount of the recombined radical increases. Thus, the quantity of the radicals which can effectively reach a reaction portion, decreases. Consequently, the deposition rate decreases.

Influence of Microwave Output

Figure 10:
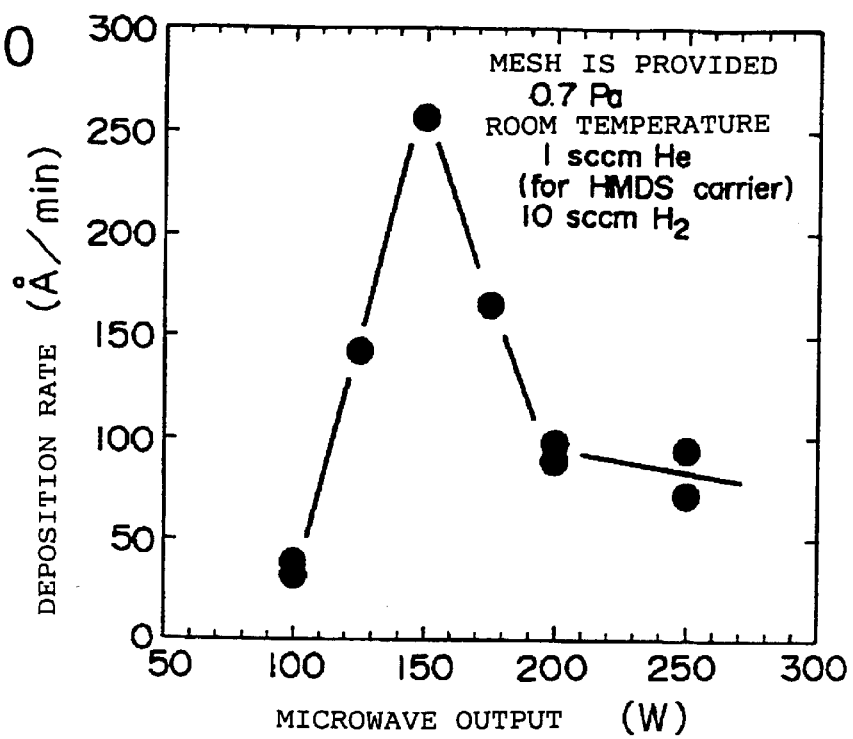
FIG. 10 illustrates the change in deposition rate versus the microwave output.

FIG. 10 illustrates a change in the deposition rate versus the microwave output. When the output is increased from 100 W to 150 W, the deposition rate rises considerably. However, when the output rises further, the deposition rate decreases conversely. The cause of this phenomenon is considered as follows. Namely, because the amount of hydrogen radical contained in plasma increases with the rise of the output, the reaction is promoted and moreover, the deposition rate increases. However, when the output exceeds 150 W, the damage to the surface of the substrate, which is owing to the charged particles and ions, becomes predominant. Consequently, the deposition rate decreases.

Moreover, it was not observed that a change in the composition ratio of the deposited film was caused by a variations in the amount of supplied source gas, in the pressure, or in the microwave.

Fundamental Characteristics of SiC Films Deposited on Plastic Material

Ultraviolet Cut-Off Characteristics of SiC Film

Figure 11:
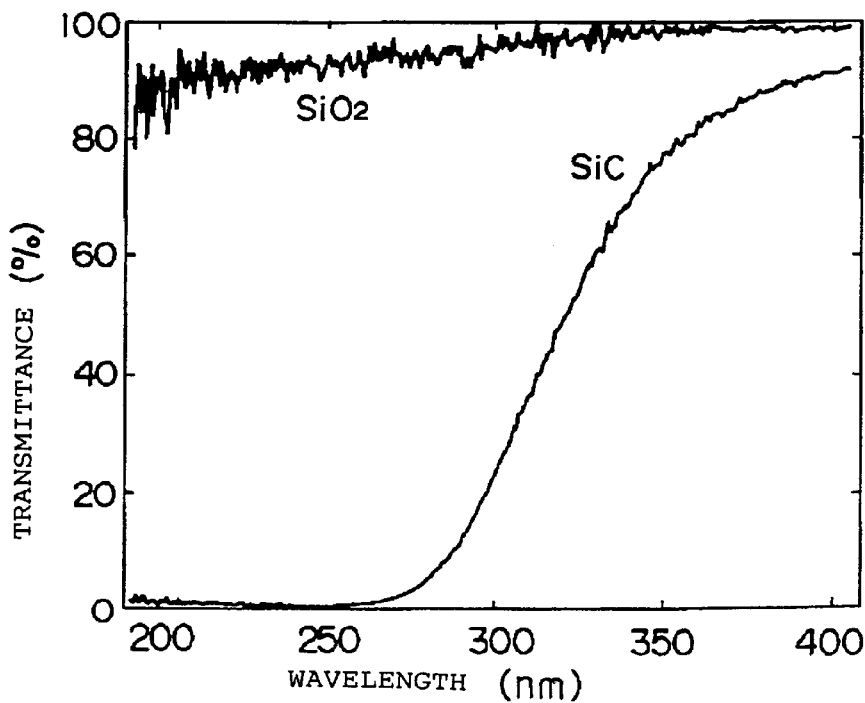
FIG. 11 is an ultraviolet spectral transmission factor or transmittance of a SiC film and a $SiO_2$ film, which are deposited at room temperature, for the comparison therebetween.

FIG. 11 illustrates the ultraviolet spectral transmission factor or transmittance of a SiC film and a SiO$_2$ film, which are deposited at room temperature, for the comparison therebetween. In the case of this measurement, a test piece obtained by depositing a film, which was 1 μm in thickness, on quartz glass was used. Incidentally, the transmittance curves of these deposited films were obtained by subtracting the absorption curve of the quartz glass from results of the measurement. As is seen from this figure, the SiO$_2$ film permits nearly all of ultraviolet rays, whose wavelengths are not more than 400 nm, to pass therethrough. In contrast, it was observed that the SiC film had the excellent ultraviolet cut-off characteristics, by which 50% of ultraviolet rays are cut off. Therefore, this film begins cutting off the ultraviolet rays, whose wavelengths are not more than 400 nm. Further, almost all of ultraviolet rays whose wavelengths are not more than 300 nm are cut off. Therefore, the SiC film deposited at a low temperature by ECR plasma is expected to serve as a film for preventing a plastic material from being deteriorated by ultraviolet light.

SEM Observation of SiC Films on Plastic Material

Based upon comparisons of SEM pictures or images of the surfaces of PC and PP materials, on which no films are deposited, it was observed that SiC films of good quality, which have no cracks, were deposited on both of PC and PP substrates. This is considered the result of the fact that the deposition of the films, by which little damage to the substrates due to heat was caused, was achieved by the use of a mesh.

Surfacial Hardness of Plastic Material on which SiC Film Was Deposited

Dynamic hardness of the surface of the plastic material in each of the cases, both before SiC film deposition and after, were measured. As a result of the deposition of SiC film, the surfacial harnesses of PC and PP substrates rises by 80% or so, as compared with the initial harnesses thereof measured before the film were deposited. Namely, this film is superior as a hard coat. Incidentally, although the same SiC films of the same thickens were deposited on the PC and PP substrates, there was observed a difference in hardness therebetween. It is considered that this is because the hardness of the substrate depends on the backing thereof.

TABLE 4

Dynamic Hardness of Polymer

| Substrate | Dynamic Hardness (HD 115 degrees) | |
|---|---|---|
| | Original | Coated with SiC Film |
| Polycarbonate | 33.6 | 58.8 |
| Polypropylene | 12.5 | 22.5 |

Summary of Results of Experiments (1) In the case of the deposition of SiC film by utilizing ECR plasma CVD activation energy was negative. Further, the vapor phase reaction proceeds simultaneously with the adsorption/desorption reaction caused on the surface of the substrate.

(2) In the case of ECR plasma techniques using a metallic mesh, the deposition of a film, in which only small damage to the substrate is observed owing to heat, can be achieved at a high speed.

(3) SiC film deposited by utilizing ECR plasma has excellent ultraviolet cut-off characteristics and thus is expected to serve as a film for preventing a plastic material from being deteriorated by ultraviolet light.

(4) The low-temperature deposition of a SiC film by utilizing ECR plasma is effective in increasing the surfacial hardness of a low-heat-resistance plastic material.

As above described, as a result of practice of the present invention, a good SiC thin film can be obtained. Namely, the SiC thin film of the present invention has sufficient hardness and has advantages in cutting off ultraviolet light. Moreover, such a SiC thin film is obtained at a low temperature.

As is obvious from the foregoing description, in accordance with the present invention, a SiC thin film provided with sufficient hardness and weather-resistance against ultraviolet light can be formed at a low temperature by utilizing ECR plasma CVD (namely, Electron Cyclotron Resonance Plasma Assisted Chemical Vapor Deposition) techniques, by which the low-temperature deposition of a film of high quality can be achieved. In accordance with the present invention, significant enhancement of functions of a surface of a plastic material can be attained. Moreover, plastic parts which have never been able to be made by using a plastic material can be practicably produced. Thus, the recycling and the reduction in weight of a larger number of parts of motor vehicles can be achieved.

The present invention can be applied to plastic parts or components of a vast array of goods, such as an automobile or motorbike. The present invention can be applied to, for example, transparent plastic lamp housing, meter panel plate, window members, the sun roof of an automobile, a plastic instrument panel of a motor-cycle, bumpers, door lock knobs, a steering wheel, trim members, a console box, plastic mirror-finished doors, mirrors and emblems of a motor vehicle, a plastic windshield or windscreen of a motorcycle, a plastic cowl, a hand lever and a fuel tank of a car, a plastic engine cover of an outboard motor, and anticorrosive coats of metallic parts or components.

The entire disclosure of Japanese Patent Application No. 8-180291 filed on Jul. 10, 1996 including specification, claims, drawings and summary are incorporated by reference in its entirety.

The entire disclosure of Japanese Patent Application No. 8-288156 filed on Oct. 30, 1996 including specification, claims, drawings and summary are incorporated by reference in its entirety.

Many other variations and modifications of the invention will be apparent to those skilled in the art without departing from the spirit and scope of the invention. The above-described embodiments and examples are, therefore, intended to be merely exemplary, and all such variations and modifications are intended to be included within the scope of the invention as defined in the appended claims.

What is claimed is:

1. A method for forming a SiC film on a base material by plasma CVD, comprising the steps of:
   applying a magnetic field to a plasma generating chamber by means of a magnetic coil placed therearound;
   introducing microwaves into said plasma generating chamber;
   introducing an ECR plasma generating gas into said plasma generating chamber to thereby generate ECR plasma;
   supplying a source gas which includes a SiC precursor from an inlet downstream from said plasma generating chamber and in fluid communication therewith;
   providing the base material downstream from said plasma generating chamber and said inlet;
   passing the ECR plasma through a grounded mesh placed between said inlet and said base material or between said plasma generating chamber and said inlet; and
   depositing the SiC film on a surface of the base material.

2. The method according to claim 1 wherein said step of providing a base material comprises providing a polymer base material.

3. The method according to claim 2 wherein said step of providing a polymer base material comprises providing a polymer base material at room temperature.

4. The method according to claim 2 further comprising the step of heating the polymer base material at a temperature ranging from 200° C. to 250° C.

5. The method according to claim 1 wherein said step of supplying a source gas comprises supplying a source gas which includes hexamethyldisilane.

6. The method according to claim 1 wherein said step of supplying a source gas comprises bubbling the SiC precursor with helium to produce the source gas and supplying the source gas.

7. The method according to claim 1 wherein said step of supplying a source gas comprises bubbling hexamethyldisilane with helium to produce the source gas, and supplying the source gas at a flow rate of between 0.8 and 1 standard cc/min.

8. The method according to claim 1 wherein said step of introducing an ECR plasma generating gas comprises introducing a gas which decomposes the SiC precursor.

9. The method according to claim 1 wherein said step of introducing an ECR plasma generating gas comprises introducing hydrogen, helium or argon.

10. The method according to claim 1 wherein said step of applying a magnetic field comprises applying a divergent magnetic field having a strength which decreases from said plasma generating chamber to said base material.

11. The method according to claim 1 wherein said step of introducing microwaves comprises introducing microwaves at between 100 W and 200 W.

12. The method according to claim 1 wherein the base material is selected from the group consisting of polyacetal resin, epoxy resin, polybutylene terephthalate, polypropylene, methacrylic resin, polycarbonate, polystyrene, ethylene acid type bis-polymer, ethylene vinyl alcohol, polyphenyl ether, polybutadiene, ABS resin, vinyl chloride, polyarylates, polyurethane resin, melamine resin, unsaturated polyester, urea resin, high-density polyethylene, low-density polyethylene, polyimide, polyethylene terephthalate, polyamide phenol, fluororesin, silicone resin, polyphenylene sulfide, polyetherketone, polyethersulfone and aromatic polyesters.

13. The method according to claim 1 wherein said step of applying a magnetic field comprises applying a magnetic field of 875 G to the plasma generating chamber.

14. The method according to claim 1 wherein said step of introducing an ECR plasma generating gas comprises introducing the ECR plasma generating gas at a flow rate of about 5 to about 50 standard cc/min.

15. The method according to claim 1 wherein the pressure in the plasma generating chamber during said depositing step is about 0.05 to about 2.0 Pa.

16. A method for forming a SiC film on a polymer base material by plasma CVD, comprising the steps of:

applying a magnetic field to a plasma generating chamber by means of a magnetic coil placed therearound;

introducing microwaves at about 100 W to about 200 W into said plasma generating chamber;

introducing an ECR plasma generating gas into said plasma generating chamber to thereby generate ECR plasma;

supplying a source gas which includes a SiC precursor from an inlet downstream from said plasma generating chamber and in fluid communication therewith;

providing the polymer base material downstream from said plasma generating chamber and said inlet, the polymer base material being at a temperature of about room temperature to about 250° C.;

passing the ECR plasma through a grounded mesh placed between said inlet and said base material or between said plasma generating chamber and said inlet; and depositing the SiC film on a surface of the polymer base material.

17. The method according to claim 16 wherein said step of supplying a source gas comprises supplying a source gas which includes hexamethyldisilane.

* * * * *